(12) United States Patent
Ashitaka et al.

(10) Patent No.: US 9,157,011 B2
(45) Date of Patent: Oct. 13, 2015

(54) POLISHING COMPOSITION

(75) Inventors: Keiji Ashitaka, Kiyosu (JP); Hitoshi Morinaga, Kiyosu (JP); Muneaki Tahara, Kiyosu (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 90 days.

(21) Appl. No.: 13/818,554

(22) PCT Filed: Aug. 25, 2011

(86) PCT No.: PCT/JP2011/069179
§ 371 (c)(1),
(2), (4) Date: Apr. 2, 2013

(87) PCT Pub. No.: WO2012/029627
PCT Pub. Date: Mar. 8, 2012

(65) Prior Publication Data
US 2013/0205682 A1 Aug. 15, 2013

(30) Foreign Application Priority Data
Aug. 31, 2010 (JP) ................................. 2010-193558

(51) Int. Cl.
C09G 1/00 (2006.01)
C09G 1/02 (2006.01)
C09K 3/14 (2006.01)
H01L 21/02 (2006.01)
H01L 21/3105 (2006.01)
B24D 3/02 (2006.01)
C09C 1/68 (2006.01)

(52) U.S. Cl.
CPC ................ *C09G 1/02* (2013.01); *C09K 3/1409* (2013.01); *C09K 3/1463* (2013.01); *H01L 21/02024* (2013.01); *H01L 21/31053* (2013.01)

(58) Field of Classification Search
CPC .................................. C09G 1/00; C09G 1/02
USPC ......................................................... 51/308
See application file for complete search history.

(56) References Cited

U.S. PATENT DOCUMENTS 6,334,880 B1 1/2002 Negrych et al.
2004/0040217 A1 3/2004 Takashina et al.

2004/0266323 A1 12/2004 Oshima et al.
2009/0111359 A1 4/2009 Suzuki et al.
2011/0209413 A1 9/2011 Nishida et al.

FOREIGN PATENT DOCUMENTS

| JP | 07-221059 A | 8/1995 |
| JP | 2001-048520 A | 2/2001 |
| JP | 2001-150334 A | 6/2001 |
| JP | 2004-146780 A | 5/2004 |
| JP | 2005-001019 A | 1/2005 |
| JP | 2007-137972 A | 6/2007 |
| JP | 2009-149493 A | 7/2009 |
| JP | 2009-176397 A | 8/2009 |

OTHER PUBLICATIONS

Weisstein, Eric W. "Chebyshev Inequality." From MathWorld—A Wolfram Web Resource. http://mathworld.wolfram.com/ChebyshevInequality.html.*
Weisstein, Eric W. "Central Limit Theorem." From MathWorld—A Wolfram Web Resource. http://mathworld.wolfram.com/CentralLimitTheorem.html.*
Fisher, Ismor http://pages.stat.wisc.edu/~ifischer/Intro_Stat/Lecture_Notes/2_-_Exploratory_Data_Analysis/2_-_Synopsis/Chebyshev_Inequality.pdf.*
Weisstein, Eric W. "Chebyshev Inequality." From MathWorld—A Wolfram Web Resource. http://mathworld.wolfram.com/ChebyshevInequality.html (Feb. 5, 2009).*
Weisstein, Eric W. "Central Limit Theorem." From MathWorld—A Wolfram Web Resource. http://mathworld.wolfram.com/CentralLimitTheorem.html (Jan. 24, 2009).*
Fisher, Ismor http://pages.stat.wisc.edu/~ifischer/Intro_Stat/Lecture_Notes/2_-_Exploratory_Data_Analysis/2_-_Synopsis/Chebyshev_Inequality.pdf (Sep. 27, 2009).*

* cited by examiner

*Primary Examiner* — Pegah Parvini
*Assistant Examiner* — Alexandra M Moore
(74) *Attorney, Agent, or Firm* — Foley & Lardner LLP

(57) ABSTRACT

A polishing composition contains colloidal silica. The colloidal silica satisfies the expression $A \times D \times E \times F \geq 350{,}000$ where "A" denotes the average aspect ratio (dimensionless) of the colloidal silica, "D" denotes the average particle diameter (units: nm) of the colloidal silica, "E" denotes the standard deviation of the particle size (units: nm) of the colloidal silica, and "F" denotes the volume fraction (units: %) of particles having a diameter of 1 to 300 nm in the colloidal silica. The volume fraction of particles having a diameter of 1 to 300 nm in the colloidal silica is 90% or greater.

4 Claims, No Drawings ial, for example, an application to polish a semiconductor wafer,

POLISHING COMPOSITION

TECHNICAL FIELD

The present invention relates to a polishing composition used mainly in polishing an object-to-be-polished, such as semiconductor wafers including silicon wafers, formed from a semiconductor device material.

BACKGROUND ART

It has been conventionally known, mainly in order to obtain a higher polishing rate, to use non-spherical colloidal silica or colloidal silica having bimodal particle diameter distribution as abrasive grains in polishing compositions (see, for example, Patent Documents 1 and 2).

However, there is still a high need for better colloidal silica in terms of overall properties including sedimentation stability.

PRIOR ART DOCUMENTS

Patent Document 1: Japanese Laid-Open Patent Publication No. 7-221059
Patent Document 2: Japanese Laid-Open Patent Publication No. 2007-137972

SUMMARY OF THE INVENTION

Problems that the Invention is to Solve

Accordingly, it is an objective of the present invention to provide a polishing composition containing colloidal silica that has both an excellent polishing rate and sedimentation stability.

Means for Solving the Problems

To achieve the foregoing objective and in accordance with one aspect of the present invention, a polishing composition containing colloidal silica is provided. When "A" denotes an average aspect ratio (dimensionless) of the colloidal silica, "D" denotes an average particle diameter (units: nm) of the colloidal silica, "E" denotes a standard deviation of the particle diameter (units: nm) of the colloidal silica, and "F" denotes a volume fraction (units: %) of particles having a diameter of 1 to 300 nm in the colloidal silica, a value obtained by the expression A×D×E×F is 350,000 or greater. The volume fraction of particles having a diameter of 1 to 300 nm in the colloidal silica is 90% or greater.

In the above described aspect, when "B" denotes a standard deviation (dimensionless) of the aspect ratio of the colloidal silica, a value obtained by the expression A×B×D×E×F is preferably 30,000 or greater.

In the above described aspect, the volume fraction of particles having a diameter of 50 nm or greater and an aspect ratio of 1.2 or greater in the colloidal silica is preferably 50% or greater.

In the above described aspect, the volume fraction of particles having a diameter of greater than 300 nm in the colloidal silica is preferably less than 2%.

Effects of the Invention

According to the present invention, there is provided a polishing composition containing colloidal silica that has both an excellent polishing rate and sedimentation stability.

MODES FOR CARRYING OUT THE INVENTION

One embodiment of the present invention will now be described.

A polishing composition according to the present embodiment contains at least colloidal silica. The polishing composition is used mainly in an application to polish an object-to-be-polished formed from a semiconductor device material, for example, an application to polish a semiconductor wafer, such as silicon wafers and compound semiconductor wafers, or dielectric or conductive material films formed on wafers.

Colloidal silica in the polishing composition is required to satisfy the following expression:

$$A \times D \times E \times F \geq 350{,}000$$

wherein "A" denotes the average aspect ratio (dimensionless) of the colloidal silica; "D" denotes the average particle diameter (units: nm) of the colloidal silica; "E" denotes the standard deviation of the particle diameter (units: nm) of the colloidal silica; and "F" denotes the volume fraction (units: %) of particles having a diameter of 1 to 300 nm in the colloidal silica, with A×D×E×F being preferably 370,000 or greater. In addition, the colloidal silica preferably satisfies the following expression:

$$A \times B \times D \times E \times F \geq 30{,}000$$

wherein "B" denotes the standard deviation (dimensionless) of the aspect ratio of the colloidal silica, With A×B×D×E×F being more preferably 60,000 or greater.

The aspect ratio of each particle in colloidal silica can be determined by dividing the length of the long side of a minimum rectangular circumscribing an image of the particle obtained by scanning electron microscopy by the length of the short side of the same rectangular. The average aspect ratio and the standard deviation of the aspect ratio of the colloidal silica are the average and standard deviation of aspect ratio of multiple particles within a visual field of a scanning electron microscope, which can be determined with a conventional image analysis software program.

The particle diameter of each particle in colloidal silica can be determined as the diameter of a circle having the same area as the area of the particle in an image thereof obtained by scanning electron microscopy. The average particle diameter and the standard deviation of the particle diameter of the colloidal silica are the average and standard deviation of particle size of multiple particles within a visual field of a scanning electron microscope, which can also be determined with a conventional image analysis software program.

When the colloidal silica satisfies A×D×E×F≥350,000, and specifically 370,000, the colloidal silica has a relatively high average aspect ratio, contains a relatively high amount of particles having the size effective for polishing, and has relatively broad particle diameter distribution, thereby allowing a high polishing rate.

When the colloidal silica satisfies A×B×D×E×F≥30,000, and specifically ≥60,000, the colloidal silica has relatively broad aspect ratio distribution as well, thereby improving the polishing rate of the polishing composition.

The volume fraction ("F") of particles having a diameter of 1 to 300 nm in the colloidal silica is required to be 90% or greater and preferably 95% or greater. When this value is 90% or greater, and specifically 95% or greater, the colloidal silica contains less amount of large particles that may easily cause sedimentation, thereby allowing high sedimentation stability. When the polishing composition has poor sedimentation stability, such disadvantages may result that many scratches may be produced on an object-to-be-polished after polishing with the polishing composition, satisfactory smoothness of the surface of the object-to-be-polished may not be obtained, or a stable polishing rate may not be obtained because the polishing composition is not supplied stably during polishing. The volume of each particle in colloidal silica can be determined as the volume of a sphere having the same diameter as the particle diameter of the particle determined by the method described above.

The volume fraction of particles having a diameter of 50 nm or greater and an aspect ratio of 1.2 or greater in the colloidal silica is preferably 50% or greater and more preferably 60% or greater. When this value is 50% or greater, and specifically 60% or greater, the colloidal silica contains more particles having the size and aspect ratio particularly effective for polishing, thereby improving the polishing rate of the polishing composition.

The volume fraction of particles having a diameter of greater than 300 nm in the colloidal silica is preferably less than 2% and more preferably less than 1.5%. When this value is less than 2%, and specifically less than 1.5%, the sedimentation stability of the polishing composition is further improved.

The content of colloidal silica in the polishing composition is not particularly limited and in general is preferably 0.1 to 20% by mass, more preferably 1.0 to 15% by mass, and still more preferably 3.0 to 10% by mass.

The pH of the polishing composition can be appropriately selected depending on the type of the object-to-be-polished. When the object-to-be-polished is a silicon wafer, the polishing composition preferably has a pH of 10 to 12. When the object-to-be-polished is a compound semiconductor, such as gallium arsenide, the polishing composition preferably has a pH of 6 to 10. When the object-to-be-polished is a semiconductor device, the polishing composition preferably has a pH of 2 to 11. When the object-to-be-polished is glass, the polishing composition preferably has a pH in the range of 2 to 4 or 9 to 11. The pH can be adjusted by adding an alkali or acid to the polishing composition.

According to the present embodiment, the following advantage is obtained.

A polishing composition of the present embodiment contains colloidal silica that satisfies $A \times D \times E \times F \geq 350{,}000$, wherein "A" is the average aspect ratio (dimensionless); "D" is the average particle diameter (units: nm); "E" is the standard deviation of the particle diameter (units: nm); and "F" is the volume fraction (units: %) of particles having a diameter of 1 to 300 nm. Accordingly, the colloidal silica has a relatively high average aspect ratio, contains a relatively high amount of particles having the size effective for polishing, and has relatively broad particle diameter distribution, thereby allowing a polishing composition of the present embodiment to have a high rate of polishing an object-to-be-polished. Because of the fact that the volume fraction of particles having a diameter of 1 to 300 nm in the colloidal silica contained in the polishing composition is 90% or greater, the colloidal silica contains less amount of large particles that may easily cause sedimentation, thereby allowing a polishing composition of the present embodiment to have high sedimentation stability. Thus according to the present embodiment, a polishing composition containing colloidal silica having both an excellent polishing rate and sedimentation stability is provided.

The above embodiment may be modified as follows.

A polishing composition of the above embodiment may further contain a known additive as required. For example, the polishing composition may contain any of the followings: (a) alkalis, such as alkali metal hydroxides, alkali metal salts, ammonia, ammonium salts, amines, amine compounds, quaternary ammonium hydroxides, and quaternary ammonium salts, (b) inorganic acids, such as hydrochloric acid, phosphoric acid, sulfuric acid, phosphonic acid, nitric acid, phosphinic acid, and boric acid, or organic acids, such as acetic acid, itaconic acid, succinic acid, tartaric acid, citric acid, maleic acid, glycolic acid, malonic acid, methanesulfonic acid, formic acid, malic acid, gluconic acid, alanine, glycine, lactic acid, hydroxyethylidene diphosphonic acid (HEDP), nitrilotris[methylene phosphonic acid] (NTMP), and phosphonobutane tricarboxylic acid (PBTC), (c) nonionic, anionic, cationic, or amphoteric surfactants, (d) water soluble polymers, such as water soluble celluloses, vinyl polymers, and polyalkylene oxides, (e) chelating agents, such as polyamines, polyphosphonic acids, polyamino carboxylic acids, and polyamino phosphonic acids, (f) oxidants, such as hydrogen peroxide, peroxides, oxygen acids, and acidic metal salt compounds, and (g) other additives, such as fungicides, bactericidal agents, and biocides.

A polishing composition of the above embodiment may be prepared by diluting an undiluted solution of the polishing composition with water.

A polishing composition of the above embodiment may be used in applications other than polishing an object-to-be-polished formed from a semiconductor device material.

Next, examples and comparative examples of the present invention will be described.

Polishing compositions of Examples 1 to 3 and Comparative Examples 1 to 10 were prepared by diluting colloidal silica slurry with pure water and then adjusting the pH with a 48% by mass potassium hydroxide aqueous solution to 11.0. The content of colloidal silica in all polishing compositions is 10.0% by mass. The details for the colloidal silica in each polishing composition, the polishing rate measured with each polishing composition, and the evaluation results of sedimentation stability of each polishing composition are shown in Table 1.

TABLE 1

|  | (A) Average aspect ratio | (B) Standard deviation of aspect ratio | (C) Volume fraction of particles having diameter of 50 nm or greater and aspect ratio of 1.2 or greater [%] | (D) Average particle diameter [nm] | (E) Standard deviation of particle diameter | (F) Volume fraction of particles having diameter of 1 to 300 nm [%] | A × D × E × F | A × B × D × E × F | Polishing rate [Å/min] | Sedimentation stability |
|---|---|---|---|---|---|---|---|---|---|---|
| Ex. 1 | 1.29 | 0.320 | 77 | 92.5 | 38.5 | 100 | 459401 | 147008 | 3758 | Good |
| Ex. 2 | 1.25 | 0.271 | 70 | 89.5 | 34.2 | 100 | 382613 | 103688 | 3801 | Good |
| Ex. 3 | 1.20 | 0.290 | 72 | 91.0 | 37.7 | 99.1 | 407979 | 118314 | 3722 | Good |
| Comp. Ex. 1 | 1.18 | 0.230 | 49 | 44.9 | 15.7 | 98.7 | 82100 | 18883 | 2405 | Slightly poor |

TABLE 1-continued

|  | (A) Average aspect ratio | (B) Standard deviation of aspect ratio | (C) Volume fraction of particles having diameter of 50 nm or greater and aspect ratio of 1.2 or greater [%] | (D) Average particle diameter [nm] | (E) Standard deviation of particle diameter | (F) Volume fraction of particles having diameter of 1 to 300 nm [%] | A × D × E × F | A × B × D × E × F | Polishing rate [Å/min] | Sedimentation stability |
|---|---|---|---|---|---|---|---|---|---|---|
| Comp. Ex. 2 | 1.25 | 0.248 | 72 | 178 | 67.1 | 64.3 | 959983 | 238076 | 4364 | Poor |
| Comp. Ex. 3 | 1.24 | 0.219 | 53 | 62.2 | 11.5 | 100 | 88697 | 19425 | 1577 | Good |
| Comp. Ex. 4 | 1.02 | 0.129 | 4.6 | 117 | 10.5 | 100 | 125307 | 16165 | 3070 | Good |
| Comp. Ex. 5 | 1.06 | 0.063 | 0.4 | 58.2 | 24.3 | 100 | 149912 | 9444 | 2917 | Good |
| Comp. Ex. 6 | 1.00 | 0.013 | 0.9 | 33.0 | 15.5 | 100 | 51150 | 665 | 1952 | Good |
| Comp. Ex. 7 | 1.03 | 0.086 | 0.5 | 90.0 | 37.6 | 100 | 348552 | 29975 | 3107 | Good |
| Comp. Ex. 8 | 1.09 | 0.123 | 0.0 | 30.5 | 3.3 | 100 | 10971 | 1349 | 760 | Good |
| Comp. Ex. 9 | 1.36 | 0.272 | 45 | 38.8 | 9.1 | 100 | 48019 | 13061 | 572 | Good |
| Comp. Ex. 10 | 1.19 | 0.250 | 38 | 38.7 | 23.1 | 100 | 106382 | 26596 | 2570 | Good |

The column entitled "Average aspect ratio" in Table 1 shows the results of measurements of the average aspect ratio of the colloidal silica in each polishing composition.

The column entitled "Standard deviation of aspect ratio" in Table 1 shows the results of measurements of the standard deviation of the aspect ratio of the colloidal silica in each polishing composition.

The column entitled "Volume fraction of particles having diameter of 50 nm or greater and aspect ratio of 1.2 or greater" in Table 1 shows the results of measurements of the volume fraction of particles having a diameter of 50 nm or greater and aspect ratio of 1.2 or greater in the colloidal silica contained in each polishing composition.

The column entitled "Average particle diameter" in Table 1 shows the results of measurements of the average particle diameter of the colloidal silica in each polishing composition.

The column entitled "Standard deviation of particle diameter" in Table 1 shows the results of measurements of the standard deviation of the particle size of the colloidal silica in each polishing composition.

The column entitled "Volume fraction of particles having diameter of 1 to 300 nm" in Table 1 shows the results of measurements of the volume fraction of particles having a diameter of 1 to 300 nm in the colloidal silica contained in each polishing composition.

The column entitled "A×D×E×F" in Table 1 shows the values obtained by multiplying the average aspect ratio of the colloidal silica in each polishing composition, the average particle diameter of the same colloidal silica, the standard deviation of the particle size of the same colloidal silica, and the volume fraction of particles having a diameter of 1 to 300 nm in the same colloidal silica together.

The column entitled "A×B×D×E×F" in Table 1 shows the values obtained by multiplying the average aspect ratio of the colloidal silica in each polishing composition, the standard deviation of the aspect ratio of the same colloidal silica, the average particle diameter of the same colloidal silica, the standard deviation of the particle size of the same colloidal silica, and the volume fraction of particles having a diameter of 1 to 300 nm in the same colloidal silica together.

The column entitled "Polishing rate" in Table 1 shows the polishing rate when the surface of a PE-TEOS (plasma-enhanced tetraethyl orthosilicate) blanket wafer was polished using each polishing composition under the polishing conditions described in Table 2. The value of the polishing rate was determined according to the following calculation formula based on the difference in the weight of each wafer before and after polishing, measured on a precision electronic balance.

Polishing rate [Å/min]=Difference in the weight of a wafer before and after polishing [g]/Polishing time [min.]/Wafer area [cm$^2$] (=20.26 cm$^2$)/True density of TEOS [g/cm$^3$] (=2.2 g/cm$^3$)×10$^8$ The column entitled "Sedimentation stability" in Table 1 shows the results of sedimentation stability of each polishing composition evaluated by placing the polishing composition in a 250-mL transparent resin container with a lid followed by leaving the sealed container at room temperature for 5 days and evaluation of the presence or absence of solid aggregations on the bottom of the container. In this column, "poor" denotes that aggregations were observed all over the bottom of the container, "slightly poor" denotes that some aggregations were observed if not all over the bottom of the container, and "good" denotes that no aggregation was observed.

TABLE 2

| | |
|---|---|
| Polishing machine: | "CP-4" from CETR |
| Polishing pad: | "IC1000 A2 PAD DD1 (kgrv)" from Nitta Haas Inc. |
| Object to be polished: | PE-TEOS blanket wafer having diameter of 50.8 mm |
| Rotation rate of head: | 300 rpm |
| Rotation rate of surface plate: | 300 rpm |
| Linear speed: | 113 m/min |
| Feed rate of polishing composition: | 20 mL/min |
| Polishing time: | 1 min |
| Polishing pressure: | 34.48 kPa |

As shown in Table 1, all of the polishing compositions of Examples 1 to 3 provided a high polishing rate of around 3800 Å/min. The polishing compositions of Examples 1 to 3 also had preferable sedimentation stabilities. In contrast, the polishing compositions of Comparative Examples 1 and 3 to 10 having a value A×D×E×F of less than 350,000 had low values for the polishing rate. The polishing composition of Comparative Example 2 in which the volume fraction of particles having a diameter of 1 to 300 nm in the colloidal silica of less than 90% had unsatisfactory sedimentation stability.

The invention claimed is:
1. A polishing composition comprising colloidal silica, wherein
when "A" denotes an average aspect ratio (dimensionless) of the colloidal silica; "D" denotes an average particle diameter (units: nm) of the colloidal silica; "E" denotes a standard deviation of the particle diameter (units: nm) of the colloidal silica; and "F" denotes a volume fraction (units: %) of particles having a diameter of 1 to 300 nm in the colloidal silica, a value obtained by the expression A×D×E×F is 350.000 or greater, the volume fraction of particles having a diameter of 1 to 300 nm in the colloidal silica is 90% or greater, the volume fraction of particles having a diameter of 50 nm or greater and an aspect ratio of 1.2 or greater in the colloidal silica is 50% or greater, the standard deviation of the particle diameter of the colloidal silica is 34.2 nm or more.

2. The polishing composition according to claim 1, wherein when "B" denotes a standard deviation (dimensionless) of an aspect ratio of the colloidal silica, a value obtained by the expression A×B×D×E×F is 30,000 or greater.

3. The polishing composition according to claim 1, wherein the volume fraction of particles having a diameter of greater than 300 nm in the colloidal silica is less than 2%.

4. The polishing composition according to claim 1, wherein "D" is 89.5 nm or more and 92.5 nm or less, and "E" is 34.2 nm or more and 38.5 nm or less.

* * * * *